United States Patent
Marso et al.

(10) Patent No.: US 6,255,709 B1
(45) Date of Patent: Jul. 3, 2001

(54) COLOR-SELECTIVE SI DETECTOR ARRAY

(75) Inventors: Michel Marso, Jülich; Michael Krüger, Aachen; Michael Berger, Bad Vilbel; Markus Thönissen, Nettetal; Hans Lüth, Aachen, all of (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/142,295
(22) PCT Filed: Mar. 8, 1997
(86) PCT No.: PCT/DE97/00457
 § 371 Date: Sep. 3, 1998
 § 102(e) Date: Sep. 3, 1998
(87) PCT Pub. No.: WO97/33302
 PCT Pub. Date: Sep. 12, 1997

(30) Foreign Application Priority Data

Mar. 8, 1996 (DE) .................................. 196 09 073

(51) Int. Cl.⁷ .................... H01L 31/06; H01L 27/14; H01L 31/00
(52) U.S. Cl. .................... 257/462; 257/431; 257/443
(58) Field of Search .................... 257/577, 431, 257/443, 462

(56) References Cited

U.S. PATENT DOCUMENTS 3,911,269 * 10/1975 Hart et al. ........................... 257/462

FOREIGN PATENT DOCUMENTS 910190386   2/1993 (JP) ..................................... 257/462
7-230983 *  8/1995 (JP) ..................................... 257/462

OTHER PUBLICATIONS

"Photodetectors fabricated from rapid–thermal–oxidized porous Si", by Tsai et al. (Applied Physics Letters, 62 (1993) No. 22.

"Porosity and composition effects in sol–gel derived interference filters" by Fabes et al. (Thin Solid Films 254, 1995).

"Color–Sensitive Si–Photodiode Using Porous Silicon Interference Filters" by Kruger et al. (Jpn. J. Applied Physics Vo. 36—1997).

"Porosity superlattices: a new class of Si heterostructures" by Berger et al. (J.Phys. D. Appl. Phys. 27—1994).

"Porous Silicon Superlattices" by Frohnhoff et al. (6156 Advanced Materials 6(1994) Dec. No. 12).

* cited by examiner

Primary Examiner—Steven Loke
(74) Attorney, Agent, or Firm—Herbert Dubno

(57) ABSTRACT

A multiplicity of components form a photodiode array on a substrate. Each of the components consists of a transistor of the p-n-p type with the outermost p-doped layer being transformed into an optical filter by control of the anodic etching operation utilizing transistor characteristics of the respective transistor. The result can provide red, blue and green filters in a color camera.

1 Claim, 2 Drawing Sheets

COLOR-SELECTIVE SI DETECTOR ARRAY

This application is a national stage of PCT/DE97/00457 filed Mar. 8, 1997 and based, in turn, on German national application 196 09 073.3 of Mar. 8, 1996 under the International Convention.

FIELD OF THE INVENTION

The present invention relates to a color selective Si detector array with individually produceable color filters of porous silicon. The invention also relates to a process for making same.

BACKGROUND OF THE INVENTION

Porous silicon is produced very simply and inexpensively by anodic etching of monocrystalline silicon in a hydrofluoric acid solution. The porosity and microstructure of the porous silicon and thus also the optical refractive index depends, among others things, upon the doping of the starting material and the etching current density. By a change with time of the etching current density or by the use of a material with an appropriate doping profile, it is possible to produce porosity supergrids which can function as optical filters, for example, as Bragg-Reflectors or Fabry-Perot-Filters (M. G. Berger et al., J. Phys. D: Appl. Phys. 27, 1333, (1994)).

The application of such filters to an optical detector, for example, a pn-diode, changes the spectral sensitivity of the detector. The use of a number of detectors, with different filters enables, for example, color recognition or the detection of an energy spectrum of incident light with spatial resolution.

OBJECT OF THE INVENTION

The object of the invention is to provide a detector array and a process for making same in which each individual detector is provided with an individual filter.

SUMMARY OF THE INVENTION

This object is achieved by an array in accordance with the invention which comprises a transistor, especially a pnp transistor, whose uppermost layer (collector layer) is transformed by anodic etching at least partly to porous silicon. The object is further attained by a process for producing a component or a multiplicity of components with optional layer sequences whereby the layer sequence has transistor functions, for example, npn transistor function, heterobipolar transistor function or pnp transistor function with a low-doped intermediate layer for producing an improved photodetector effect.

According to this aspect of the invention, the upper layer or layer sequence is made porous, an electrolyte provided above the layer sequence serves as one of the transistor connections, and the other transistor connections are suitably biased (especially both of them) so that each individual transistor is supplied with the desired etching current for forming a desired filter. Further preferred or advantageous embodiments or "variants" include a transistor wherein the porous layer is formed by doping modulation in the upper p layer and/or by modulation of the etching current so that an optical filter effect is achieved.

An array, especially a detector array, can be formed with a multiplicity such transistors. By respective electrical energization of the respective transistor electrodes and thus the formation of different etching currents, a porous silicon layer is formed during the etching of the respective transistor with optical characteristics individual to that transistor. The emitters of the individual transistors can be connected columnwise and the base terminals can be connected row-wise or vice versa so that with the aid of suitable row and column voltages, individual transistors or transistor groups are controllable.

The nonanodically etched p layer and/or n layer can be so formed as a pn photodetector that the porous layer is effective as an optical filter. The nonanodically etched p layer or layers of individual components can be electrically so connected row-wise and the n layer or n layers can be so electrically connected columnwise that by an optical excitation generated electrical signal can be tapped from individual pn diodes between the associated row conductors and column conductor.

The components according to the invention can be formed as a plurality of filters, especially three, with the colors red, blue and green as a color filter, especially for a color camera.

One or more components can form a reference for other color filter elements or for evaluating bright/dark information of incident light by etching.

A component or multiplicity of components according to the invention can have a layer sequence of the following pattern:

substrate-n-p-n-p, whereby the upper pnp transistor is used for the control of the anodic etching and the lower npn transistor is used as a phototransistor.

In the process of the invention in which the collector layer of a pnp transistor is converted by anodic etching at least partly into porous silicon, the etching current is controlled by the transistor functions by application of suitable biases to the electrolyte and the electrodes (base, emitter) which are not in direct contact with the electrolyte.

The invention provides a multiplicity of pnp transistors on an insulating or undoped or n-doped substrate.

The layer which lies closest to the substrate serves as emitter, the n-layer serves as the base, and the p-layer lying at the LS murface serves as the collector. The individual transistors are electrically separated from one another by an appropriate insulation (for example, mesa etching, insulation-implantation or the like).

Advantageously, an array of cells can be fabricated in which each cell contains pixel detectors for different colors, for example, red, green, blue. In addition, the array can be controlled for column-wise and row-wise readout.

BRIEF DESCRIPTION OF THE DRAWING

The above and other objects, features, and advantages will become more readily apparent from the following description, reference being made to the accompanying drawing in which.

SPECIFIC DESCRIPTION

In the etching process for producing the porous silicon, substantially only the p collector layer is etched through (completely or partly) when the etching is carried out with the exclusion of light. In this case, because of the negligible tendency toward pore formation in the n-doped material, the latter can be used as an etch stop for the base layer. In etching under the effect of light, the n-layer can also be partly etched. The etching current which is used can be the collector current of the pnp transistor with appropriate emitter voltage and base voltage. The collector layer is probiased through the electrolyte. For the etching, an etching current must flow from the silicon to the electrolyte. This is precisely the case with a pnp transistor when the upper layer is electrically connected as the collector. By appropriate modulation of the emitter voltage or the base voltage and an emitter current or base current, the desired porosity supergrid or superimposed porosity grid can be etched in the collector layer of the transistor.

Figure 1:
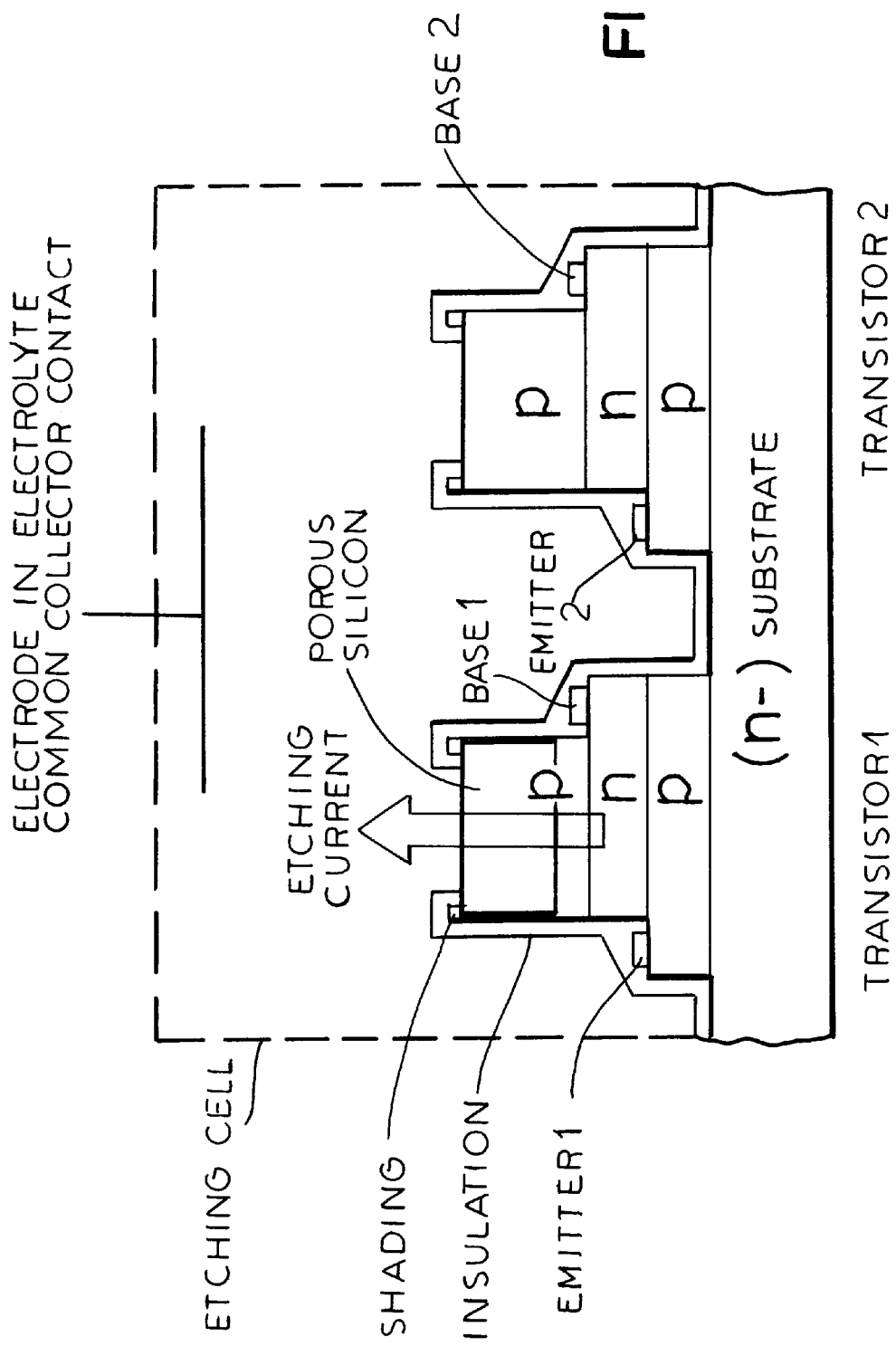
FIG. 1 is a diagram showing anodic etching of an array according to the invention in an etching cell.

In the production of a multiplicity of detector elements, the transistors can be individually switched in or switched out or modulated or switched in or switched out or modulated in groups. The anodic etching occurs only on the collector layers at which the current flow takes place at any instant (FIG. 1). In this manner, it is possible, for example, to provide a third of the components with red filters, a third of the components with blue filters and a third of the components with green filters, respectively.

An advantageous electrical connection of the transistors is provided when the emitter contacts are formed columnwise and the base contacts are formed row-wise (or the reverse) for interconnection with one another. By the application of appropriate voltages at columns and rows, the transistors can be controlled individually or row-wise or columnwise.

Figure 2:
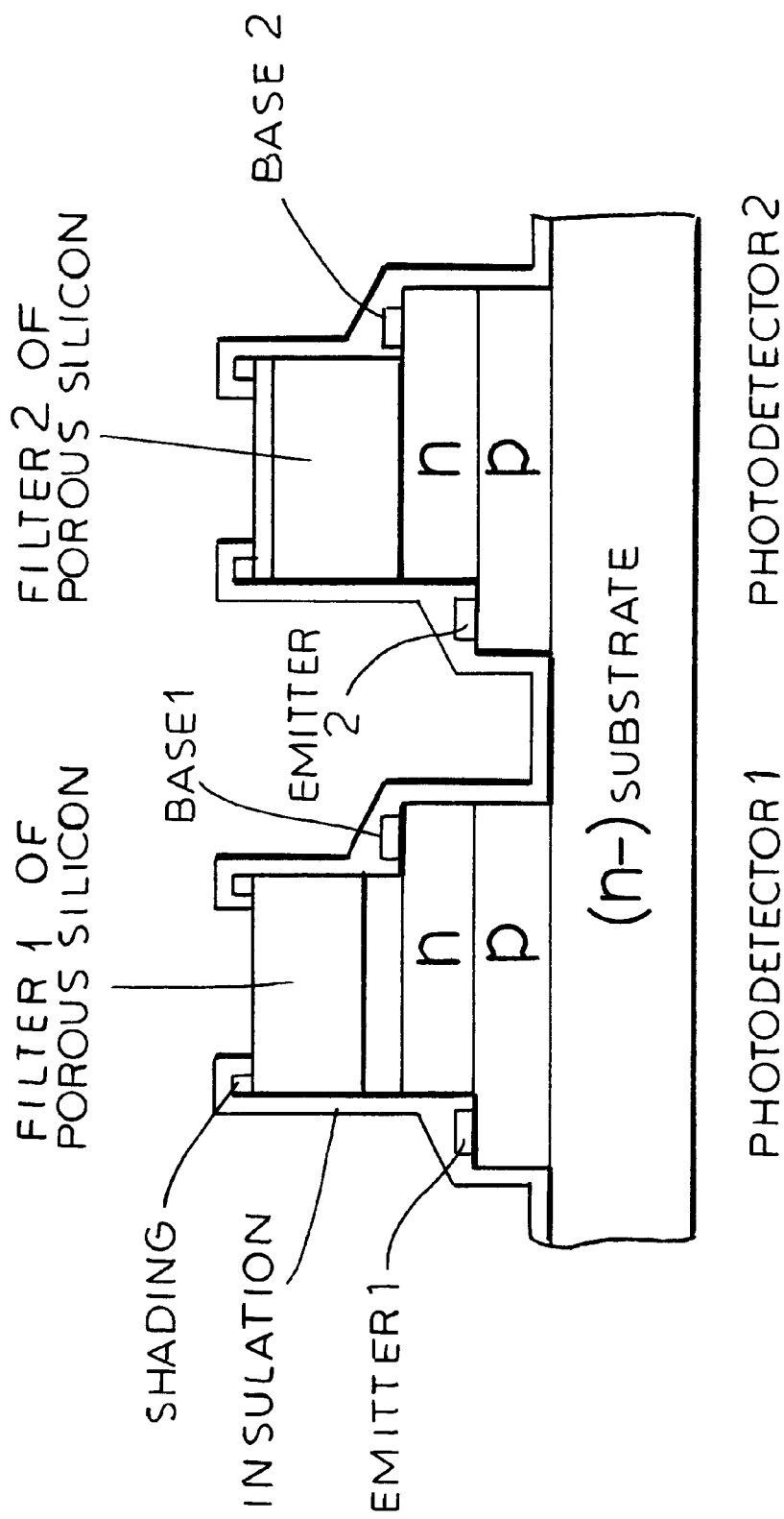
FIG. 2 is a diagrammatic cross section of an array with two pn photodetectors with different filters.

In the use of the structure which is generated as optical detectors, the light passes through the layer system of porous silicon in the emitter-base pn diode which is used as a pn photo detector. The electrical signal which is generated is tapped off between the emitter contact and the base contact (FIG. 2).

With the above described row-wise and columnwise connection of the base electrodes and the emitter electrodes, the electrical signal of each individual pn diode can be tapped from corresponding row contacts and column contacts.

For the formation of an arrangement with a multiplicity of transistor functions with different filters, the following procedure, given in detail, can be applied:

1. Generation of a pnp layer sequence on insulating or undoped or n-doped silicon substrate or on a substrate or another material. The doping when provided of the n-doped silicon substrateor the p or n layers can be in the range between, for example, $1\times10^{14} cm^3$ and $1\times10^{20} cm^3$, the layer thicknesses amounting to, for example, 10 nm to 100 $\mu$m so that the layer sequences have transistor functions. The generation of the layer sequence can be effected with the aid of epitaxial growth or implantation or diffusion or a combination of these procedures.

2. Etching to expose the base layer.

3. Etching to expose the emitter layer.

4. Etching to isolate individual transistors.

NOTE: Instead of the etching to lay open the transistor layers, contact implantations are also possible, for example, an n-implantation for contacting the base layer.

Isolation etching can also be replaced by suitable implantations.

5. Netallization for the contacting of the emitter layer and base layer.

6. Row-wise and columnwise connection of the emitter terminals or collector terminals. Crossings and mesa flanks are electrically insulated by insulation layers.

7. Definition of the etching surfaces by an insulation layer. This is advantageously formed to be opaque to light, since the light to be detected does not pass through the underetched boundary region of the porosity filter into the detector.

NOTE: The production of the component array can also be achieved with other sequences of steps.

8. Anodic etching of the upper p layer. The transistors are energized individually or in groups in order to generate individual porosity superlattices.

9. Use as a detector array with pn diodes readable row-wise and columnwise whereby the single diodes have individual spectral sensitivities.

The process of the invention combines the advantages of conventional silicon technology with the very economical process of producing porous silicon. It allows the production of a photodetector array with row-wise and columnwise control in a particularly simple and economical manner and with individual spectral sensitivities for each individual detector. This enables the simple fabrication of an integrated color camera. The pnp structure used can be employed for the production of a read logic and for electronic further processing. It is also possible to apply MOS Technology upon a substrate.

What is claimed is:

1. A multiplicity of components on a common substrate and in the form of transistors, each of said transistors being formed from a stack of layers including a p layer, an n layer and a p-doped silicon layer transformed to porous silicon and forming respective color filters for the colors red, blue and green to form a color camera.

* * * * *